(12) United States Patent
Jeong et al.

(10) Patent No.: US 9,428,078 B2
(45) Date of Patent: Aug. 30, 2016

(54) METHOD OF UTILIZING POWER TRANSISTOR OF FUEL CELL STACK DIAGNOSTIC SYSTEM

(71) Applicants: Hyundai Motor Company, Seoul (KR); KANGNAM UNIVERSITY INDUSTRY-ACADEMIA COOPERATION FOUNDATION, Yongin-si, Gyeonggi-do (KR)

(72) Inventors: Kwi Seong Jeong, Yongin-si (KR); Sae Hoon Kim, Yongin-si (KR); Uck-Soo Kim, Anytang-si (KR); Hyun-Seok Park, Gunpo-si (KR); Young-Hyun Lee, Yongin-si (KR)

(73) Assignees: HYUNDAI MOTOR COMPANY, Seoul (KR); KANGNAM UNIVERSITY INDUSTRY-ACADEMIA COOPERATION FOUNDATION, Yongin-Si, Gyeonggi-Do (KR)

( * ) Notice: Subject to any disclaimer, the term of this patent is extended or adjusted under 35 U.S.C. 154(b) by 385 days.

(21) Appl. No.: 14/135,274

(22) Filed: Dec. 19, 2013

(65) Prior Publication Data

US 2014/0247053 A1 Sep. 4, 2014

(30) Foreign Application Priority Data

Mar. 4, 2013 (KR) ........................ 10-2013-0022838

(51) Int. Cl.
*H01M 8/04* (2016.01)
*B60L 11/18* (2006.01)
(Continued)

(52) U.S. Cl.
CPC ............... *B60L 15/007* (2013.01); *B60L 1/02* (2013.01); *B60L 3/0053* (2013.01); *B60L 3/12* (2013.01); *B60L 7/04* (2013.01); *B60L 7/12* (2013.01); *B60L 7/22* (2013.01); *B60L 11/189* (2013.01); *B60L 11/1883* (2013.01); *B60L 11/1885* (2013.01); *B60L 11/1892* (2013.01); *B60L 11/1894* (2013.01); *G01R 31/40* (2013.01);
(Continued)

(58) Field of Classification Search
None
See application file for complete search history.

(56) References Cited

U.S. PATENT DOCUMENTS 8,333,125 B2 12/2012 Tsai et al.
2002/0116099 A1* 8/2002 Tabata ................ B60K 6/32
701/22

(Continued)

FOREIGN PATENT DOCUMENTS

EP 2 226 882 A1 9/2010
JP 2006-210070 A 8/2006
(Continued)

*Primary Examiner* — Jonathan Crepeau
(74) *Attorney, Agent, or Firm* — McDermott Will & Emery LLP

(57) ABSTRACT

A method and an apparatus using a power transistor in a fuel cell stack diagnostic system provides an apparatus using a power transistor in a fuel cell stack diagnostic system. The apparatus includes a regenerative braking detector that detects regenerative braking of a fuel cell vehicle equipped with a fuel cell stack diagnostic system; a voltage rise determiner that determines whether a voltage rise due to regenerative braking of a fuel cell vehicle is a predetermined value or more; and a power transistor controller that controls an AC signal generator so that the voltage due to the regenerative braking is discharged by the power transistor, when the voltage rise due to regenerative braking determined by the voltage rise determiner is a predetermined value or more.

6 Claims, 6 Drawing Sheets

(51) Int. Cl.
*G01R 31/40* (2014.01)
*B60L 15/00* (2006.01)
*B60L 1/02* (2006.01)
*B60L 3/00* (2006.01)
*B60L 7/12* (2006.01)
*B60L 3/12* (2006.01)
*B60L 7/04* (2006.01)
*B60L 7/22* (2006.01)

(52) U.S. Cl.
CPC ....... *H01M 8/0432* (2013.01); *H01M 8/04559* (2013.01); *H01M 8/04567* (2013.01); *H01M 8/04589* (2013.01); *B60L 2240/36* (2013.01); *B60L 2240/425* (2013.01); *B60L 2240/445* (2013.01); *B60L 2240/662* (2013.01); *B60L 2260/56* (2013.01); *H01M 2250/20* (2013.01); *Y02T 10/645* (2013.01); *Y02T 10/7291* (2013.01); *Y02T 90/16* (2013.01); *Y02T 90/34* (2013.01)

(56) References Cited

U.S. PATENT DOCUMENTS

2004/0220752 A1* 11/2004 Gopal ................ G01R 31/3658
702/31
2009/0226770 A1* 9/2009 Manabe ............ H01M 8/04567
429/431

FOREIGN PATENT DOCUMENTS

| | | |
|---|---|---|
| JP | 4016536 B2 | 12/2007 |
| JP | 2008-066006 A | 3/2008 |
| KR | 10-2010-0121354 A | 11/2010 |
| KR | 10-2011-0062136 A | 6/2011 |
| KR | 10-1148764 B1 | 5/2012 |

* cited by examiner

--Prior Art--

METHOD OF UTILIZING POWER TRANSISTOR OF FUEL CELL STACK DIAGNOSTIC SYSTEM

CROSS-REFERENCE TO RELATED APPLICATION

This application claims priority to and the benefit of Korean Patent Application No. 10-2013-0022838 filed in the Korean Intellectual Property Office on Mar. 4, 2013, the entire contents of which are incorporated herein by reference.

BACKGROUND

1. Technical Field

The present disclosure relates to a method and an apparatus using a power transistor in a fuel cell stack diagnostic system.

2. Background

Fuel cells are a type of power generation device that converts chemical energy of a fuel into electric energy, using an electrochemical reaction in a fuel cell stack, as opposed to burning the fuel into heat.

The fuel cells can be useful for supplying power to small-sized electric/electronic products as well as supplying power for industry, home, and vehicles.

For example, Polymer Electrolyte Membrane Fuel Cells, or Proton Exchange Membrane Fuel Cells (PEMFC), which have the highest power density among fuel cells, have been widely studied as a power supply for driving vehicles. PEMFCs have quick start time and power conversion reaction time due to a low operation temperature.

A PEMFC includes a Membrane Electrode Assembly (MEA) having a catalytic electrode layer, where electrochemical reaction is generated, attached to both sides of a solid polyelectrolyte membrane in which hydrogen ions move, a Gas Diffusion Layer (GDL) that uniformly distributes reaction gases and transmits generated electric energy, a gasket and a fastener that maintain air-tightness of the reaction gases and a coolant and appropriate fastening pressure, and a separator or Bipolar Plate that moves the reaction gases and the coolant.

When a fuel cell stack is assembled by putting the unit cells together, the combination of a MEA and a GDL, which are main parts, is positioned at the innermost portion of the cells, in which the MEA has catalytic electrode layers coated with a catalyst so that hydrogen and oxygen can react. An anode and a cathode are arranged on both sides of the polyelectrolyte membrane, respectively. The GDL, the gasket, and other components. are stacked in the outer area where the anode and the cathode are positioned.

A separator with flow fields through which reaction gases that include hydrogen as a fuel and oxygen or air as an oxidizer, are supplied and a coolant flows is positioned outside the GDL.

A plurality of unit cells is stacked, with the configuration as a unit cell, and then end plates for supporting a current collector, an insulating plate, and stacked cells are coupled to the outermost side, in which a fuel cell stack is achieved by repeatedly stacking and fastening the unit cells between the end plates.

The number of unit cells stacked should be enough to obtain the required potential for a vehicle. The potential generated by one unit cell is about 1.3V. A plurality of cells may be stacked in series to produce the power for driving a vehicle.

The fuel cell stack composed of a plurality of cells, as described above, requires diagnosis to check whether desired performance and/or status is maintained.

FIG. 1 schematically shows a conventional diagnostic fuel cell stack diagnostic system.

Referring to FIG. 1, a conventional diagnosis and heat management system for a fuel cell stack may include an alternating current injector 20 that injects a diagnostic alternating current into a fuel cell stack 10 and a diagnostic analyzer 30 that diagnoses the fuel cell stack by analyzing a change in alternating current due to the injection of the diagnostic alternating current.

A conventional fuel cell stack diagnostic system generally performs diagnosis through Total Harmonic Distortion Analysis (THDA) of a diagnostic AC signal. To perform THDA, the diagnostic analyzer 30 may include a harmonic analyzer.

When a diagnostic alternating current $I_{AC}$ is injected into the fuel cell stack 10 by the alternating current injector 20, the diagnostic alternating current $I_{AC}$ overlaps the current $I_{STACK}$ of the fuel cell stack 10. Therefore, the diagnostic alternating current $I_{AC}$ is included in the current $I_{LOAD}$ flowing to a load 40.

While the current $I_{STACK}$ of the fuel cell stack 10 and the diagnostic alternating current $I_{AC}$ of the alternating current injector 20 overlap each other and flow to the load 40, the diagnostic analyzer 30 diagnoses the status and/or a problem in the fuel cell stack 10 by detecting the voltage of the fuel cell stack 10. The diagnostic analyzer 30 may then perform frequency conversion on the detected voltage, and then analyze the result.

However, the alternating current injector 20 of the conventional diagnostic system necessarily includes a decoupling capacitor CT for preventing collision of the diagnostic alternating current and the direct current of the fuel cell stack 10, when applying the diagnostic alternating current to the fuel cell stack 10.

The decoupling capacitor CT of the alternating current injector 20 should have a considerably large capacity, because it is required to pass a low-frequency alternating current.

Accordingly, the decoupling capacitor CT of the alternating current injector 20 is implemented by connecting tens of small-capacity capacitors CN in parallel, such that it may have a problem in that the cost is high and the size is large.

Distortion of the diagnostic AC signal may be generated, when the diagnostic alternating current of the alternating current injector 20 passes through the decoupling capacitor CT, such that precise diagnosis may not be achieved.

The above information disclosed in this Background section is only for enhancement of understanding of the background of the disclosure.

SUMMARY

The present disclosure provides an apparatus and method having advantages of using a power transistor included in a fuel cell stack diagnostic system which diagnoses a fuel cell stack economically without distortion of an alternating current with a simple configuration, by applying an AC signal for diagnosis to the gate of the base of the power transistor so that some of the current of the fuel cell stack can flow in a sine wave through the power transistor.

That is, the present disclosure provides an apparatus and a method that make it possible to use the power transistor included in the fuel cell stack diagnostic system as a discharge circuit when a voltage is increased by regenerative braking of a fuel cell vehicle, use the heat generated by the power transistor for preheating in cold start, and use the power transistor as a heater in winter.

An exemplary embodiment of the present disclosure provides an apparatus using a power transistor in a fuel cell stack diagnostic system including a diagnosis control analyzer that diagnoses and analyzes the status of the fuel cell stack by measuring the current and the voltage of the fuel cell stack, an AC signal generator that generates a diagnostic AC signal in accordance with control of the diagnosis control analyzer, and the power transistor that is driven in response to an AC signal outputted from the AC signal generator and includes a diagnostic AC component into the current of the fuel cell stack. The apparatus may include: a regenerative braking detector configured to detect regenerative braking of a fuel cell vehicle equipped with the fuel cell stack diagnostic system; a voltage rise determiner configured to determine whether a voltage rise due to regenerative braking of a fuel cell vehicle is a predetermined value or more; and a power transistor controller configured to control the AC signal generator so that the voltage due to the regenerative braking is discharged by the power transistor, when the voltage rise due to regenerative braking determined by the voltage rise determiner is a predetermined value or more.

The fuel cell stack diagnosis system may include one or more microprocessors that are operated by a non-transitory computer program configured to perform the operations of generating a diagnostic AC signal; making the current of the fuel cell stack become an alternating current by the diagnostic AC signal and the alternating current flow to the fuel cell stack diagnostic system; and diagnosing the fuel cell stack by analyzing a change in the alternating current flowing through the fuel cell stack diagnostic system.

Further, the apparatus using a power transistor of a fuel cell stack diagnostic system according to an exemplary embodiment of the present disclosure may further include: a temperature sensor configured to detect the temperature of a motor room or an engine room or the temperature of the coolant in the fuel cell vehicle; and a temperature determiner configured determine whether the temperature detected by the temperature sensor is a predetermined temperature or less, and the power transistor controller may allow the heat generated by the power transistor to be used for preheating or heating the fuel cell vehicle, when the temperature detected by the temperature sensor is a predetermined temperature or less.

Another exemplary embodiment of the present disclosure provides a method of using a power transistor in a fuel cell stack diagnostic system including a diagnosis control analyzer that diagnoses and analyzes the status of the fuel cell stack by measuring the current and the voltage of the fuel cell stack, an AC signal generator that generates a diagnostic AC signal in accordance with control of the diagnosis control analyzer, and the power transistor that is driven in response to an AC signal outputted from the AC signal generator and includes a diagnostic AC component into the current of the fuel cell stack. The method may include: detecting regenerative braking of a fuel cell vehicle equipped with the fuel cell stack diagnostic system; determining whether a voltage rise due to regenerative braking of a fuel cell vehicle is a predetermined value or more; and discharging the voltage due to the regenerative braking by the power transistor, when the voltage rise due to regenerative braking is a predetermined value or more.

The method of using a power transistor in a fuel cell stack diagnostic system may further include: detecting the temperature of a motor room or an engine room and the temperature of a coolant in the fuel cell vehicle; determining whether the detected temperature is a predetermined temperature or less; and using heat generated by the power transistor for preheating the fuel cell vehicle, when the detected temperature is the predetermined temperature or less.

The method of using a power transistor in a fuel cell stack diagnostic system may further include: generating a diagnostic AC signal; adding the diagnostic AC signal to the current of the fuel cell stack so that the current of the fuel cell stack may include an AC component; and diagnosing the fuel cell stack by analyzing a voltage change in the fuel cell stack according to the current of the fuel cell stack including the AC component.

As described above, according to an exemplary embodiment of the present disclosure, it is possible to use the power transistor included in the fuel cell stack diagnostic system as a discharge circuit when a voltage is increased by regenerative braking of a fuel cell vehicle, use the heat generated by the power transistor for preheating in cold start, and use the power transistor as a heater in winter.

DETAILED DESCRIPTION

Figure 1:
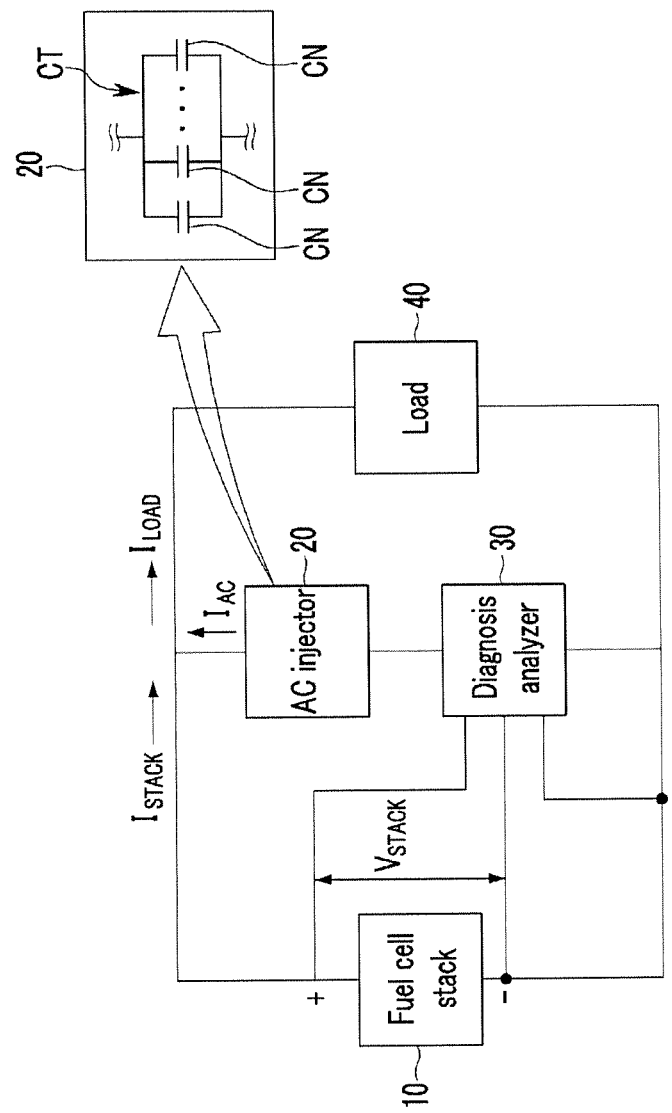
FIG. 1 is a schematic diagram of an example of a conventional fuel cell stack diagnostic system.

Hereinafter, the present disclosure will be described more fully hereinafter with reference to the accompanying drawings, in which exemplary embodiments of the disclosure are shown. However, the present disclosure is not limited to the exemplary embodiments described herein and may be embodied in other ways.

Like reference numerals are given to like components throughout the specification.

Figure 2:
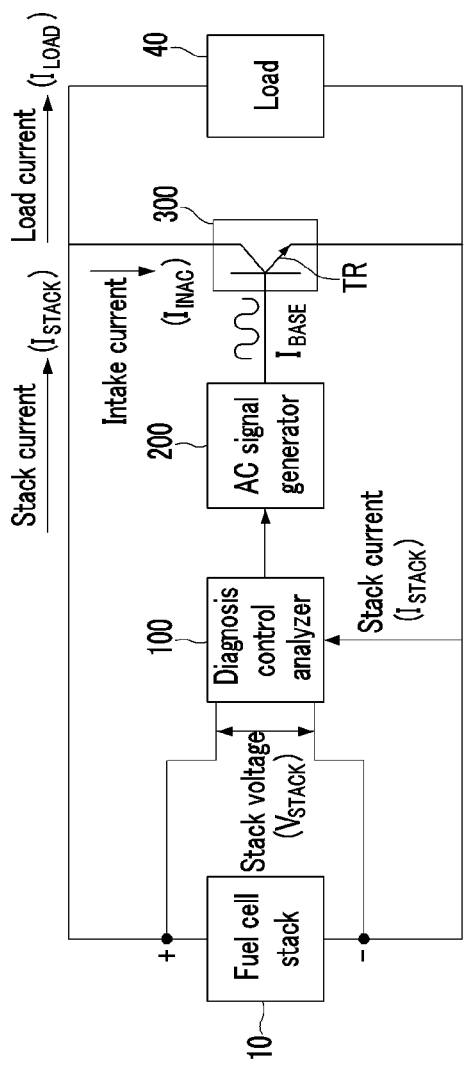
FIG. 2 is a schematic diagram of a fuel cell stack diagnostic system including a power transistor to which an apparatus and a method according to an exemplary embodiment of the present disclosure are applied.

FIG. 2 is an exemplary schematic diagram of a fuel cell stack diagnostic system including a power transistor to which an apparatus and a method according to an exemplary embodiment of the present disclosure are applied.

As shown in FIG. 2, a fuel cell stack diagnostic system including a power transistor may include: a diagnosis control analyzer 100 that diagnoses and analyzes the status of the fuel cell stack 10 by measuring the frequency of the current $I_{STACK}$ and the voltage $V_{STACK}$ of the fuel cell stack 10; an AC signal generator 200 that generates a diagnostic AC signal $I_{BASE}$ in accordance with control of the diagnosis control analyzer 100; and a power transistor 300 that is an AC component driving device driven in response to an AC signal outputted from the AC signal generator 200 and including a diagnostic AC component into the current $I_{STACK}$ of the fuel cell stack 10.

The diagnosis control analyzer 100 can diagnose the fuel cell 10 stack on the basis of the current and the voltage of the fuel cell stack 10 including the AC component passing through the load 40.

The power transistor 300 may be, for example, a FET, but it should be understood that the scope of the present disclosure is not limited thereto. The present disclosure can be applied to other configurations that correspond to the FET, even if they are different from the above configuration.

The diagnosis control analyzer 100 and the AC signal generator 200 may be implemented by one or more microprocessors operating in accordance with a predetermined non-transitory computer program or hardware including the microprocessors.

The diagnosis control analyzer 100 and the AC signal generator 200 may be implemented in one integrated unit.

As described above, the operation of a fuel cell stack diagnostic system including a power transistor to which an apparatus and a method according to an exemplary embodiment of the present disclosure are applied is described hereafter.

Figure 3:
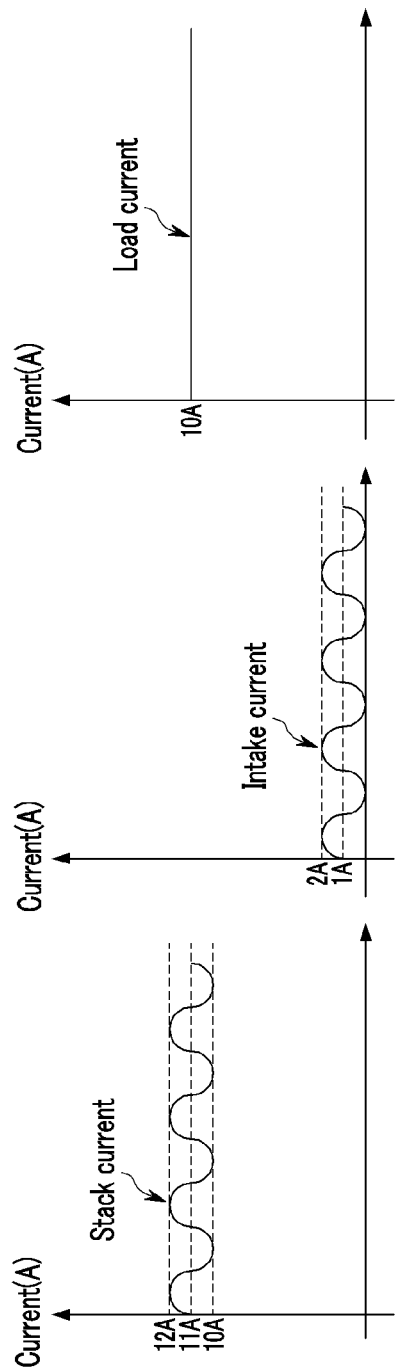
FIG. 3 is a graph illustrating the operation of the fuel cell stack diagnostic system shown in FIG. 2.

When the fuel cell stack 10 starts to be diagnosed, the AC signal generator 200 generates and supplies an AC signal $I_{BASE}$ to the gate or the base of a power transistor TR shown in FIG. 3 in accordance with the control of the diagnosis control analyzer 100 such that an intake current $I_{INAC}$ can flow to the power transistor TR.

As is well known in the art, considerably small power is applied to the gate or the base of the power transistor TR.

The AC signal $I_{BASE}$ supplied to the gate or the base of the power transistor TR, which is a current in an amplification region, is controlled to flow as much as an amplification ratio to the gate or the base.

When the AC signal generator 200 supplies the AC signal $I_{BASE}$ to the power transistor TR, an AC component is included in the current $I_{STACK}$ of the fuel cell stack 10, as shown in FIG. 3, because the intake current $I_{INAC}$ flows in the power transistor TR.

As the AC component is included in the current $I_{STACK}$ of the fuel cell stack 10, an AC component is included in the load current $I_{LOAD}$ too, which flows in the load 40.

As described above, when the intake current $I_{INAC}$ is generated by the operation of the power transistor TR and an AC component, for example, alternating current, is generated in the current $I_{STACK}$ of the fuel cell stack 10, the diagnosis control analyzer 100 diagnoses a trouble and/or the status of the fuel cell stack 10 by analyzing the frequency of the voltage and/or the current of the fuel cell stack 10 including the AC component by means of a common diagnostic method.

That is, the fuel cell stack diagnostic system including a power transistor to which an apparatus and a method according to an exemplary embodiment of the present disclosure are applied can diagnose the fuel cell stack 10 through the process of generating a diagnostic AC signal for a fuel cell stack, a process of injecting the diagnostic AC signal into a fuel cell stack, and a process of analyzing an AC change relating to the fuel cell stack 10 according to the injection of the diagnostic alternating current.

Figure 4:
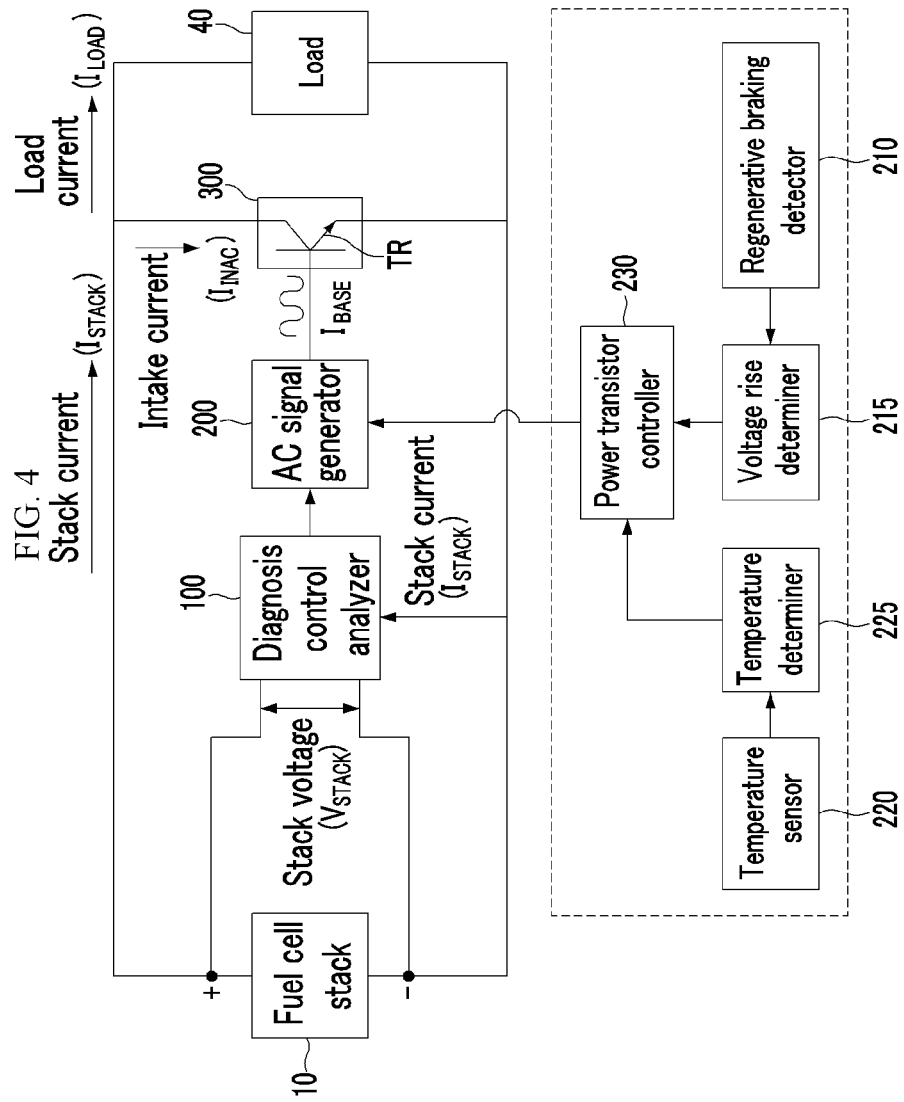
FIG. 4 is a schematic diagram of an apparatus using a power transistor of a fuel cell stack diagnostic system according to an exemplary embodiment of the present disclosure.

FIG. 4 is a schematic diagram of an apparatus using a power transistor of a fuel cell stack diagnostic system according to an exemplary embodiment of the present disclosure.

An apparatus using a power transistor of a fuel cell stack diagnostic system makes it possible to use the power transistor included in the fuel cell stack diagnostic system as discharge circuit when a voltage is increased by regenerative braking of a fuel cell vehicle. The apparatus may also use the heat generated by the power transistor for preheating in cold start, and use the power transistor as a heater in winter.

The apparatus using a power transistor of a fuel cell stack diagnostic system according to an exemplary embodiment of the present disclosure may include: a regenerative braking detector 210 that detects regenerative braking of a fuel cell vehicle equipped with the fuel cell stack diagnostic system; a voltage rise determiner 215 that determines whether a voltage rise due to regenerative braking of a fuel cell vehicle is a predetermined value or more; and a power transistor controller 230 that controls the AC signal generator so that the voltage due to the regenerative braking is discharged by the power transistor 300, when the voltage rise due to regenerative braking determined by the voltage rise determiner 215 is a predetermined value or more.

Further, one exemplary apparatus using a power transistor of a fuel cell stack diagnostic system may include: a temperature sensor 220 that detects the temperature of a motor room or an engine room or the temperature of the coolant in the fuel cell vehicle; and a temperature determiner 225 that determines whether the temperature detected by the temperature sensor 220 is a predetermined temperature or less. The power transistor controller 230 can allow the heat generated by the power transistor 300 to be used for preheating or heating the fuel cell vehicle, when the temperature detected by the temperature sensor 220 is a predetermined temperature, such as 3° C. below zero, or less.

In one example, the temperature sensor 220 may be a sensor, for example, which is disposed in a motor room or an engine room and detects the temperature of the motor room or engine room or the temperature of the coolant, however, the scope of the present disclosure is not limited thereto. The present disclosure can be applied to other configurations that actually detect the temperature of a motor room or the temperature of the engine room, even if they have different configurations.

The regenerative braking detector 210, the voltage rise determiner 215, and the temperature determiner 225 are easily implemented by those skilled in the art through a common electric and electronic control technology used for a vehicle, a fuel cell vehicle, or a hybrid vehicle, respectively, and thus they are not described in more detail.

The power transistor controller 230 may be implemented by one or more microprocessors or electric/electronic devices operated by a predetermined non-transitory computer program and the program may be constructed by a series of commands for performing a method of using a power transistor of the fuel cell stack diagnostic system according to an exemplary embodiment of the present disclosure.

Hereinafter, a method of using a power transistor of the fuel cell stack diagnostic system according to an exemplary embodiment of the present disclosure is described with reference to the accompanying drawings.

Figure 5:
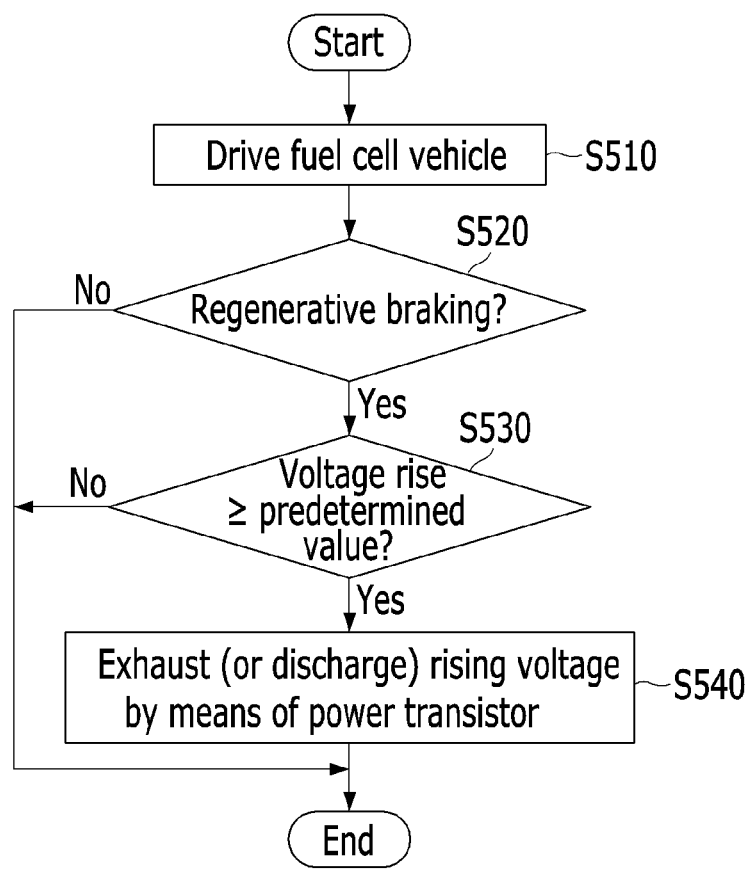
FIG. 5 is a flowchart illustrating a method of using a power transistor of a fuel cell stack diagnostic system according to an exemplary embodiment of the present disclosure.

FIG. 5 is a flowchart illustrating a method of using a power transistor of a fuel cell stack diagnostic system.

The method of using a power transistor of a fuel cell stack diagnostic system involves using the power transistor as a discharge circuit when voltage rises due to regenerative braking of a fuel cell vehicle.

For example, the regenerative braking detector 210 may detect regenerative braking while a fuel cell vehicle mounted with the fuel cell stack diagnostic system (FIG. 2).

The fuel cell stack diagnostic system may diagnose the fuel cell stack while the regenerative braking is detected. That is, the fuel cell stack diagnostic system may operate while the fuel cell vehicle travels.

When the regenerative braking of the fuel cell vehicle is detected by the regenerative braking detector 210, the voltage rise determiner 215 may determine whether the voltage rise due to the regenerative braking of the fuel cell vehicle is a predetermined value or more (S530).

When the voltage rise due to the regenerative braking of the fuel cell vehicle is the predetermined value or more, the voltage rise determiner 215 may transmit a signal saying the fact to the power transistor controller 230.

When the signal saying that the voltage rise due to the regenerative braking of the fuel cell vehicle is the predetermined value or more is transmitted from the voltage rise determiner 215, the power transistor controller 230 may send out a request signal for discharging the voltage due to the regenerative braking by means of the power transistor 300 to the AC signal generator 200.

When receiving the request signal for discharging the voltage due to the regenerative braking by means of the power transistor 300 from the power transistor controller 230, the AC signal generator 200 may change the AC signal that has been supplied to the gate or the base of the power transistor 300 so that the voltage due to the regenerative braking can be discharged.

When the AC signal is changed and supplied to the power transistor 300 so that the voltage due to the regenerative braking can be discharged, the voltage generated by the regenerative braking may be consumed as operation consumption power by the power transistor 300, such that damage by the voltage rise due to the regenerative braking can be prevented.

The magnitude of the AC signal supplied to the power transistor may vary in accordance with the magnitude of the voltage due to the regenerative braking. That is, the magnitude of the voltage due to the regenerative braking and the magnitude of the AC signal may be proportioned.

Figure 6:
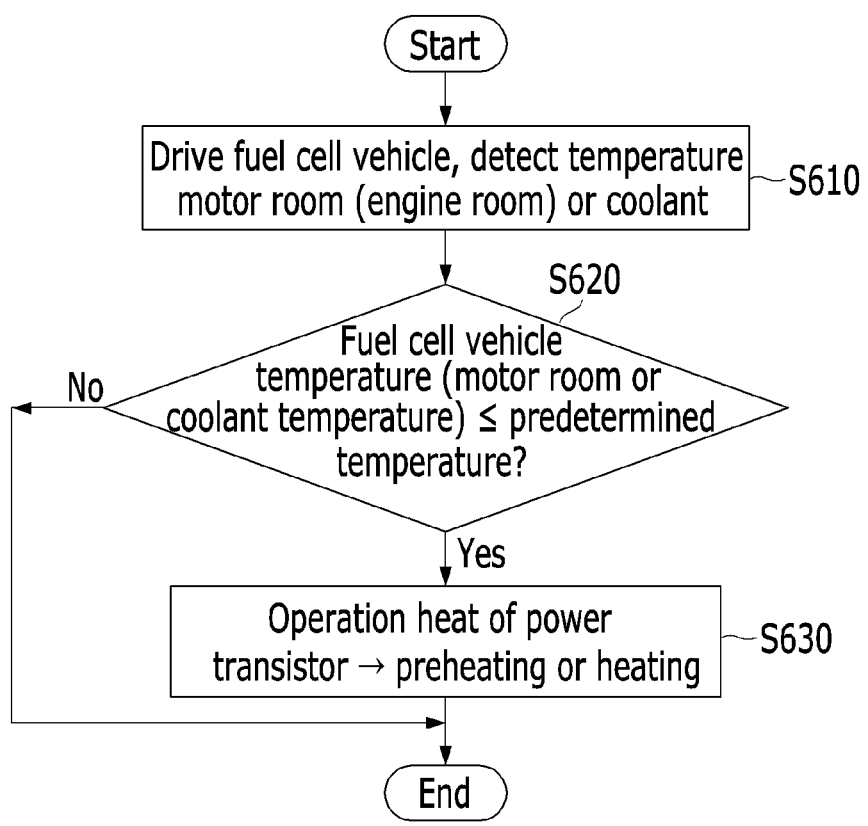
FIG. 6 is a flowchart illustrating a method of using a power transistor of a fuel cell stack diagnostic system according to another exemplary embodiment of the present disclosure.

FIG. 6 is a flowchart illustrating a method of using a power transistor of a fuel cell stack diagnostic system according to another exemplary embodiment of the present disclosure.

The method of using a power transistor of a fuel cell stack diagnostic system shown in FIG. 6 may use heat from the power transistor for preheating in cold start and use the power transistor as a heater in winter.

For example, the temperature sensor 220 detects the temperature of a motor room or engine room and the temperature of the coolant in the fuel cell vehicle mounted with the fuel cell stack diagnostic system (FIG. 2) while the fuel cell vehicle travels in step S610.

In S610, the fuel cell stack diagnostic system may diagnose the fuel cell stack. That is, the fuel cell stack diagnostic system may operate while the fuel cell vehicle travels.

When the temperature of the motor room or engine room or the temperature of the coolant in the fuel cell vehicle is detected by the temperature sensor 220, the temperature determiner 225 may determine whether the temperature detected by the temperature sensor 220 is a predetermined temperature or less in step S620.

When the temperature detected by the temperature sensor 220 is the predetermined temperature or less, the temperature determiner 225 may transmit a signal saying the fact to the power transistor controller 230.

When the signal saying that the temperature detected by the temperature sensor 220 is the predetermined temperature or less is transmitted from the temperature determiner 225, the power transistor controller 230 may supply a request signal for increasing the operation heat of the power transistor 300 to the AC signal generator 200 (S630).

That is, when a request signal for increasing the operation heat of the power transistor 300 is transmitted from the power transistor controller 230, the AC signal generator 200 may change the AC signal that has been supplied to the gate or the base of the power transistor 300 into an AC signal corresponding to the request signal.

When the AC signal changed to increase the operation heat is supplied to the power transistor 300, since the power transistor 300 generates additional operation heat, preheating in cold start can be achieved by the additional heat.

When the AC signal for increasing the operation heat is supplied to the power transistor 300, as described above, the power transistor 300 can function as a heater in winter, because it generates additional operation heat other than the operation heat accompanying diagnosis of the fuel cell stack.

It will be apparent to those skilled in the art that the intensity of the addition operation heat can be easily adjusted by controlling the magnitude of the alternating current supplied to the power transistor.

The method of using a power transistor of a fuel cell stack diagnostic system according to an exemplary embodiment of the present disclosure described above may be performed both of while the fuel cell stack is diagnosed and when the fuel cell stack is not diagnosed.

When diagnosing the fuel cell stack, the fuel cell stack diagnostic system, as described above, may diagnose the fuel cell stack 10 through the process of generating a diagnostic AC signal for a fuel cell stack, a process of injecting the diagnostic AC signal into a fuel cell stack, and a process of analyzing an AC change relating to the fuel cell stack 10 according to the injection of the diagnostic alternating current.

Therefore, it is possible to use the power transistor included in the fuel cell stack diagnostic system as a discharge circuit when a voltage is increased by regenerative braking of a fuel cell vehicle. It is also possible to use the heat generated by the power transistor for preheating in cold start, and use the power transistor as a heater in winter.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. An apparatus comprising:
   a fuel cell stack;
   a fuel cell stack diagnostic system including: a diagnosis control analyzer that diagnoses and analyzes a status of the fuel cell stack by measuring a current and a voltage of the fuel cell stack; an alternating current (AC) signal generator that generates a diagnostic AC signal in accordance with control of the diagnosis control analyzer; and a power transistor that is driven in response to the diagnostic AC signal outputted from the AC signal generator and includes a diagnostic AC component into the current of the fuel cell stack;

a regenerative braking detector configured to detect regenerative braking of a fuel cell vehicle equipped with the fuel cell stack diagnostic system;

a voltage rise determiner configured to determine whether a voltage rise due to regenerative braking of the fuel cell vehicle is a predetermined value or more; and a power transistor controller configured to control the AC signal generator so that the voltage due to the regenerative braking is discharged by the power transistor, when the voltage rise due to regenerative braking determined by the voltage rise determiner is the predetermined value or more.

2. The apparatus of claim 1, wherein the fuel cell stack diagnosis system further includes:

one or more microprocessors that are programmed to be operated by a non-transitory computer program configured to perform the operations of: generating, by the AC signal generator the diagnostic AC signal; making, by the power transistor, the current of the fuel cell stack become an AC by the diagnostic AC signal to flow the AC into the fuel cell stack diagnostic system; and diagnosing, by the diagnosis control analyzer, the fuel cell stack by analyzing a change in the AC which flows through the fuel cell stack diagnostic system.

3. The apparatus of claim 1, further comprising:

a temperature sensor configured to detect the temperature of a motor room or an engine room or the temperature of a coolant in the fuel cell vehicle; and a temperature determiner configured to determine whether the temperature detected by the temperature sensor is a predetermined temperature or less, wherein the power transistor controller is configured to use heat generated by the power transistor for preheating the fuel cell vehicle, when the temperature detected by the temperature sensor is the predetermined temperature or less.

4. A method of using a power transistor in a fuel cell stack diagnostic system, which includes: a diagnosis control analyzer that diagnoses and analyzes the status of the fuel cell stack by measuring the current and the voltage of the fuel cell stack; an AC signal generator that generates a diagnostic AC signal in accordance with control of the diagnosis control analyzer; and the power transistor that is driven in response to the diagnostic AC signal outputted from the AC signal generator and includes a diagnostic AC component into the current of the fuel cell stack, the method comprising:

detecting regenerative braking of a fuel cell vehicle equipped with the fuel cell stack diagnostic system;

determining whether a voltage rise due to regenerative braking of the fuel cell vehicle is a predetermined value or more; and discharging the voltage due to the regenerative braking by the power transistor, when the voltage rise due to regenerative braking is a predetermined value or more.

5. The method of claim 4, further comprising:

generating a diagnostic AC signal;

adding the diagnostic AC signal to the current of the fuel cell stack so that the current of the fuel cell stack includes an AC component; and diagnosing the fuel cell stack by analyzing a voltage change in the fuel cell stack according to the current of the fuel cell stack including the AC component.

6. The method of claim 5, further comprising:

detecting the temperature of a motor room or an engine room or the temperature of a coolant in the fuel cell vehicle;

determining whether the detected temperature is a predetermined temperature or less; and making heat generated by the power transistor be used for preheating the fuel cell vehicle, when the detected temperature is the predetermined temperature or less.

* * * * *